(12) United States Patent
Chen et al.

(10) Patent No.: US 9,677,745 B2
(45) Date of Patent: Jun. 13, 2017

(54) LED LAMP STRUCTURE AND ILLUMINATING MODULE THEREOF

(71) Applicant: Lediamond Opto Corporation, New Taipei (TW)

(72) Inventors: Peng-Yu Chen, New Taipei (TW); Chung-Ting Tseng, New Taipei (TW); Hsuan-Hsien Lee, New Taipei (TW)

(73) Assignee: LEDIAMOND OPTO CORPORATION, New Taipei (TW)

( * ) Notice: Subject to any disclaimer, the term of this patent is extended or adjusted under 35 U.S.C. 154(b) by 35 days.

(21) Appl. No.: 14/960,718

(22) Filed: Dec. 7, 2015

(65) Prior Publication Data

US 2016/0377267 A1   Dec. 29, 2016

(30) Foreign Application Priority Data

Jun. 23, 2015 (TW) .............................. 104209985 U

(51) Int. Cl.
| | |
|---|---|
| *F21V 7/07* | (2006.01) |
| *F21V 19/00* | (2006.01) |
| *F21V 7/04* | (2006.01) |
| *F21K 9/233* | (2016.01) |
| *F21Y 115/10* | (2016.01) |
| *H01L 25/075* | (2006.01) |
| *H01L 33/54* | (2010.01) |

(52) U.S. Cl.
CPC .............. *F21V 19/001* (2013.01); *F21K 9/233* (2016.08); *F21V 7/04* (2013.01); *F21Y 2115/10* (2016.08); *H01L 25/0753* (2013.01); *H01L 33/54* (2013.01)

(58) Field of Classification Search
CPC ... F21V 19/001; H01L 33/54; H01L 25/0753; F21K 9/233; F21Y 2115/10
USPC ............. 362/296.07, 296.05, 311.02, 311.06
See application file for complete search history.

(56) References Cited

U.S. PATENT DOCUMENTS

| | | | |
|---|---|---|---|
| 6,361,190 B1* | 3/2002 | McDermott | .......... F21V 7/0066 257/E33.059 |
| 6,550,953 B1* | 4/2003 | Ichikawa | ............. G02B 6/0021 257/E25.02 |

* cited by examiner

*Primary Examiner* — Vip Patel
(74) *Attorney, Agent, or Firm* — Chun-Ming Shih; HDLS IPR Services

(57) ABSTRACT

In a LED lamp structure and an illuminating module thereof, the illuminating module includes a circuit board, a flat plate LED, an electrical pin and a packaging colloid. The circuit board has a length, a first and a second side formed at two sides of the length. The flat plate LED is fixed and electrically connected with the circuit board, bulges at the first side, and includes a substrate and at least one LED grain assembled on the substrate. The flat plate LED can emit omnidirectional light because the substrate is made of transparent material. The electrical pin is fixed and electrically connected with the circuit board and bulges at the second side. The packaging colloid covers the circuit board and the flat plate LED and has a rectangular plastic block. Thereby, the LED lamp structure can remain traditional appearance of a halogen lamp, for collecting and focusing light.

10 Claims, 7 Drawing Sheets

LED LAMP STRUCTURE AND ILLUMINATING MODULE THEREOF

TECHNICAL FIELD

The disclosure relates to a lamp structure, more particularly to a LED lamp structure and an illuminating module thereof.

BACKGROUND

Traditionally, a halogen bulb is assembled at the center of a bowl-shaped reflective cup of a halogen lamp, such that the reflection is optimized by assembling the light source at the center of the bowl-shaped reflective cup.

However, halogen bulbs have the following disadvantages: short lifespan, high failure rate and high electricity consumption, such that they cannot follow the "green" trend. In contrast, LEDs have the advantages of low electricity consumption, small size, fast response, low pollution, high reliability and suitability for mass production, such that LEDs have been replacing halogen lamps and are becoming mainstream light sources.

However, LEDs need to be assembled on circuit boards, such that LEDs cannot be disposed closely to the center of the bowl-shaped reflective cup when the circuit boards are disposed in the bowl-shaped reflective cup because circuit boards are flat-shaped. Since the highest reflection occurs at the center of the bowl-shaped reflective cup, when the LEDs cannot be disposed at the center of the bowl-shaped reflective cup, the reflection of the reflective cup is not satisfied.

Accordingly, the inventor(s) seek to solve the above described problem and improve the present lamps.

SUMMARY

One purpose of the disclosure is to provide a LED lamp structure and an illuminating module thereof, wherein a circuit board can vertically pass through and be fixed to a rectangular shell, a flat plate LED bulges at the one side of the circuit board, and a substrate is made of transparent material, such that the flat plate LED is disposed closely to the center of the bowl-shaped cup, the light emitted from the LED grain on the substrate can directly pass through the substrate to the bowl-shaped cup for further reflection, such that the LED lamp structure can remain the appearance of a traditional halogen lamp and can achieve the effect of collecting and focusing light.

To reach this goal, the disclosure provides a LED lamp structure comprising: a lamp cup, having a bowl-shaped cup and a rectangular shell extending from an end of the bowl-shaped cup; and an illuminating module, passing through and fixed inside the rectangular shell, the illuminating module comprising: a circuit board, passing through and fixed to the rectangular shell, wherein the circuit board has a length, a first side and a second side, and the first side and the second side are formed at two sides of the length; a flat plate LED, fixed and electrically connected with the circuit board, wherein the flat plate LED bulges at the first side and is exposed from the bowl-shaped cup, the flat plate LED comprises a substrate and at least one LED grain assembled on the substrate, and the substrate is made of transparent material; an electrical pin, fixed and electrically connected with the circuit board, wherein the electrical pin bulges at the second side and is exposed from the rectangular shell; and a packaging colloid, covering the circuit board and the flat plate LED, wherein the packaging colloid has a rectangular plastic block embedded inside the rectangular shell.

To reach this goal, the disclosure provides an illuminating module, comprising: a circuit board, having a length, a first side and a second side, wherein the first side and the second side are formed at two sides of the length; a flat plate LED, fixed and electrically connected with the circuit board, wherein the flat plate LED bulges at the first side, the flat plate LED comprises a substrate and at least one LED grain assembled on the substrate, and the substrate is made of transparent material; an electrical pin, fixed and electrically connected with the circuit board, wherein the electrical pin bulges at the second side; and a packaging colloid, covering the circuit board and the flat plate LED, wherein the packaging colloid has a rectangular plastic block.

DETAILED DESCRIPTION

Figure 1:
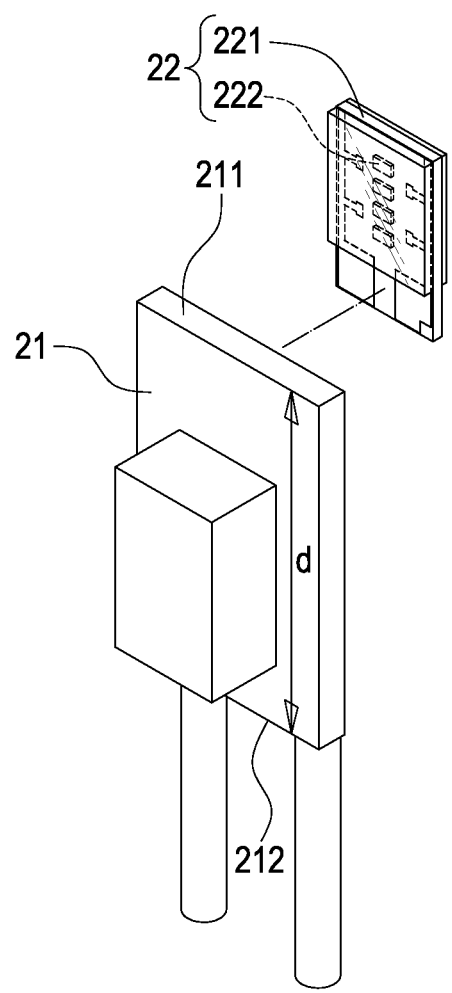
FIG. 1 is an exploded view of an illuminating module of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

As shown in FIGS. 1 to 7, the disclosure provides a LED lamp structure and an illuminating module thereof. The LED lamp structure 10 mainly comprises a lamp cup 1 and an illuminating module 2. The illuminating module 2 comprises a circuit board 21, a flat plate LED 22, an electrical pin 23 and a packaging colloid 24.

As shown in FIGS. 4 to 7, the lamp cup 1 has a bowl-shaped cup 11 and a rectangular shell 12 extending from an end of the bowl-shaped cup 11. More specifically, the rectangular shell 12 is a rectangular conical and annular block 121, and the size of the peripheral edge of the rectangular conical and annular block 121 decreases along with the direction away from the bowl-shaped cup 11. Wherein, the bowl-shaped cup 11 is bowl-shaped so as to meet the requirement of optical designs.

As shown in FIGS. 1 to 7, the illuminating module 2 passes through and is fixed inside the rectangular shell 12. The illuminating module 2 comprises a circuit board 21, a flat plate LED 22, an electrical pin 23 and a packaging colloid 24.

The circuit board 21 passes through and is fixed to the rectangular shell 12. The circuit board 21 has a length d, a first side 211 and a second side 212, and the first side 211 and the second side 212 are formed at two sides of the length d.

The direction of the length d is parallel to the extending direction of the rectangular shell 12.

The flat plate LED 22 is fixed and electrically connected with the circuit board 21. The flat plate LED 22 bulges at the first side 211 and is exposed from the bowl-shaped cup 11. The flat plate LED 22 comprises a substrate 221 and one or a plurality of LED grain 222 assembled on the substrate 221. The substrate 221 is made of transparent material, such that the flat plate LED 22 can emit omnidirectional light. The electrical pin 23 is fixed and electrically connected with the circuit board 21. The electrical pin 23 bulges at the second side 212 and is exposed from the rectangular shell 12.

The packaging colloid 24 covers the circuit board 21 and the flat plate LED 22. The packaging colloid 24 has a rectangular plastic block 241. More specifically, the rectangular plastic block 241 is a rectangular and conical block 2411, and the size of the peripheral edge of the rectangular and conical block 2411 gradually decreases along with the direction of the flat plate LED 22 toward the electrical pin 23. The rectangular and conical block 2411 is embedded inside the rectangular conical and annular block 121.

In addition, the packaging colloid 24 has a convex and curved plastic block 242 connected with one side of the rectangular plastic block 241. The size of the convex and curved plastic block 242 gradually decreases along with the direction away from the rectangular plastic block 241. The convex and curved plastic block 242 covers the flat plate LED 22, and the rectangular plastic block 241 covers the circuit board 21. Wherein, the convex and curved plastic block 242 and the rectangular plastic block 241 are integrally formed.

Figure 2:
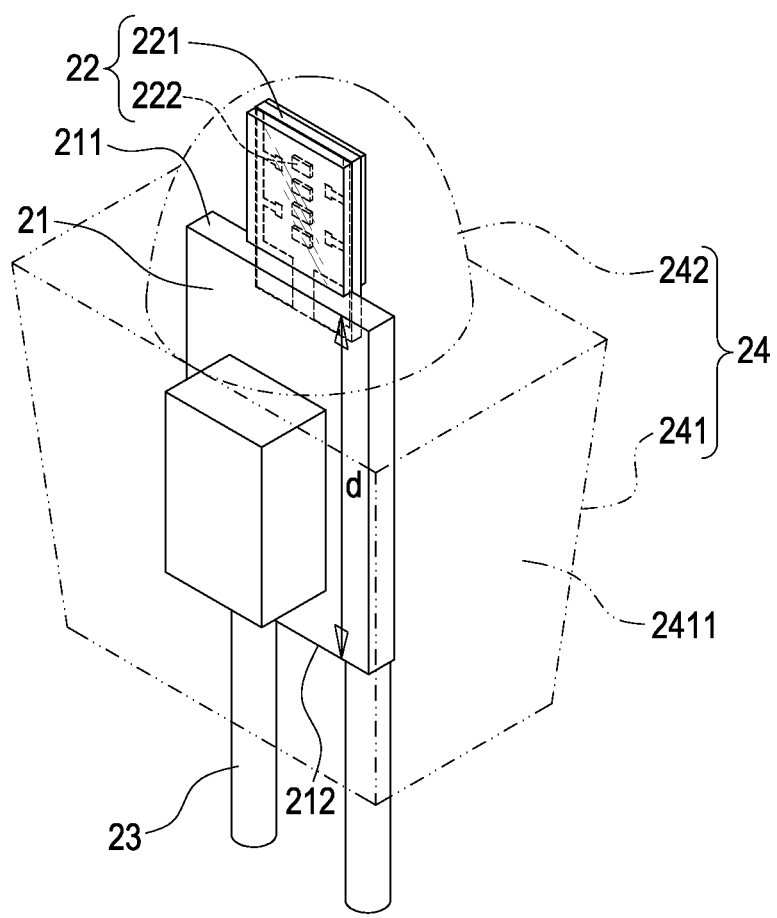
FIG. 2 is a schematic view of an illuminating module of the disclosure.
Figure 3:
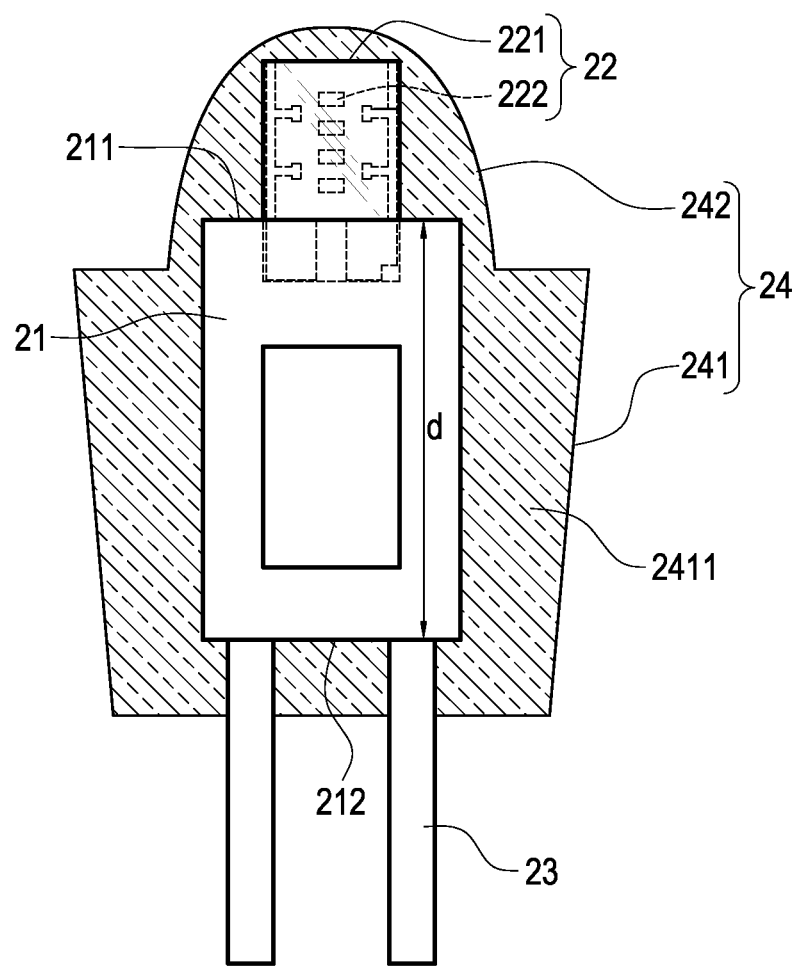
FIG. 3 is a sectional view of an illuminating module of the disclosure.
Figure 4:
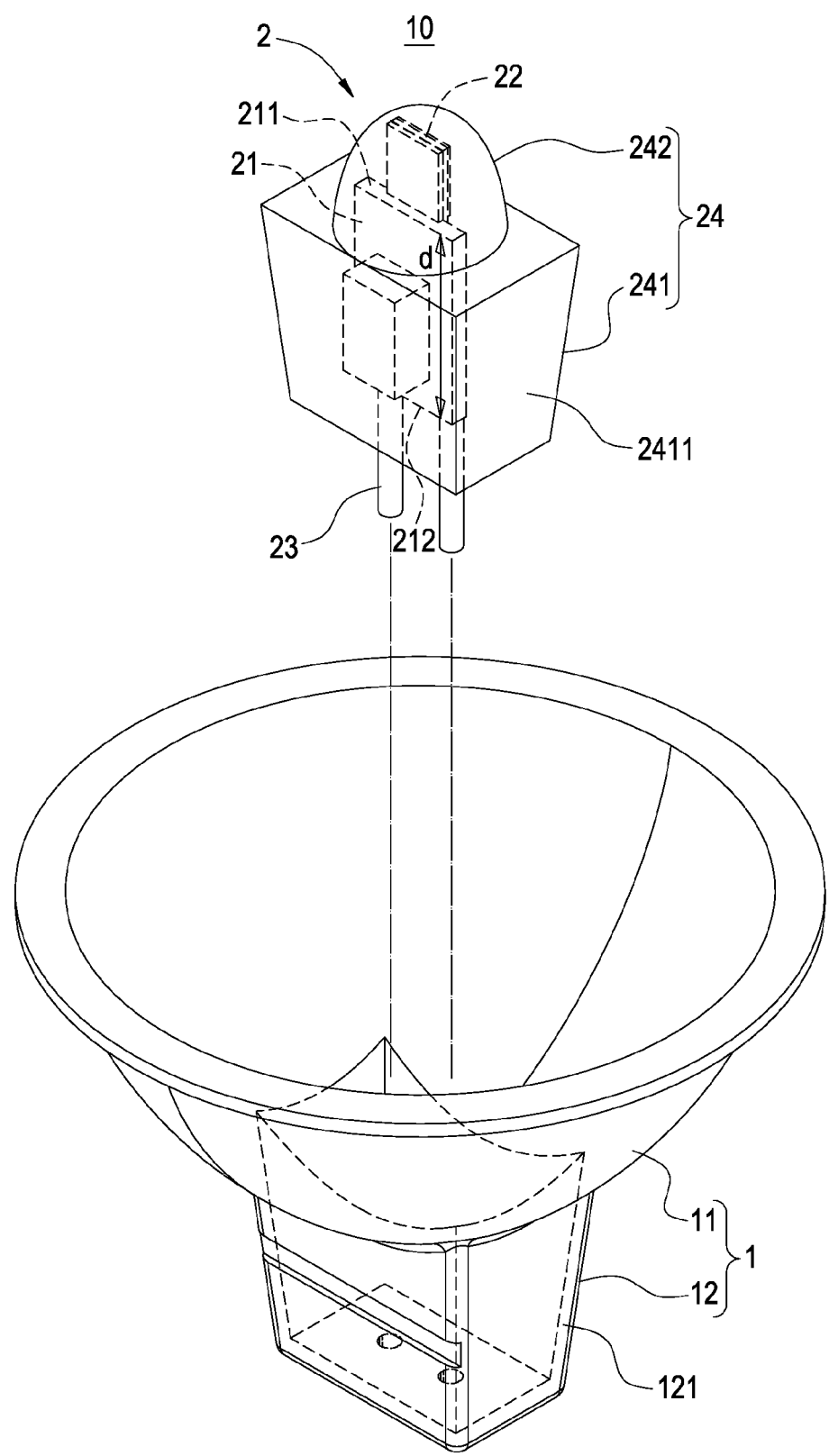
FIG. 4 is an exploded view of a LED lamp structure of the disclosure.

As shown in FIGS. 2 and 3, according to the illuminating module 2 of the disclosure, the circuit board 21 has a length d, a first side 211 and a second side 212, and the first side 211 and the second side 212 are formed at two sides of the length d; the flat plate LED 22 is fixed and electrically connected with the circuit board 21, the flat plate LED 22 bulges at the first side 211, the flat plate LED 22 comprises a substrate 221 and at least one LED grain 222 assembled on the substrate 221, and the substrate 221 is made of transparent material, such that the flat plate LED 22 can emit omnidirectional light; the electrical pin 23 is fixed and electrically connected with the circuit board 21, and the electrical pin 23 bulges at the second side 212; the packaging colloid 24 covers the circuit board 21 and the flat plate LED 22, and the packaging colloid 24 has a rectangular plastic block 241.

Figure 5:
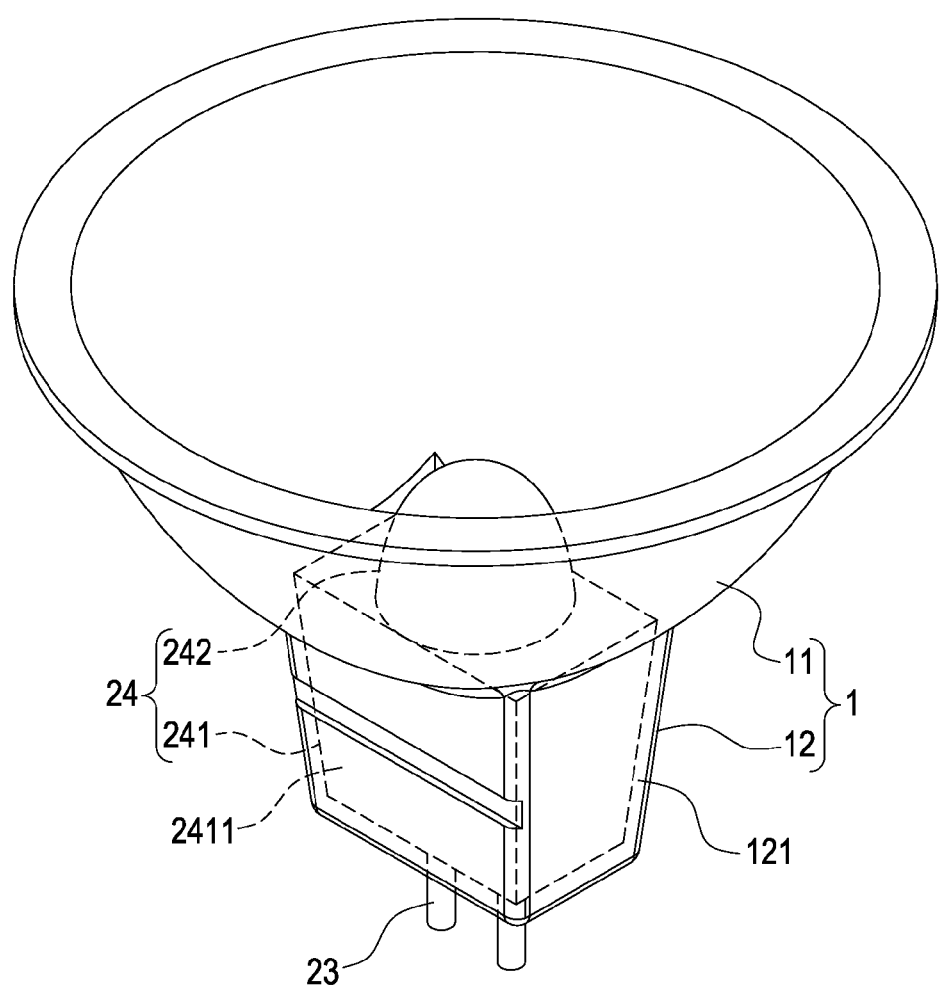
FIG. 5 is a schematic view of a LED lamp structure of the disclosure.
Figure 6:
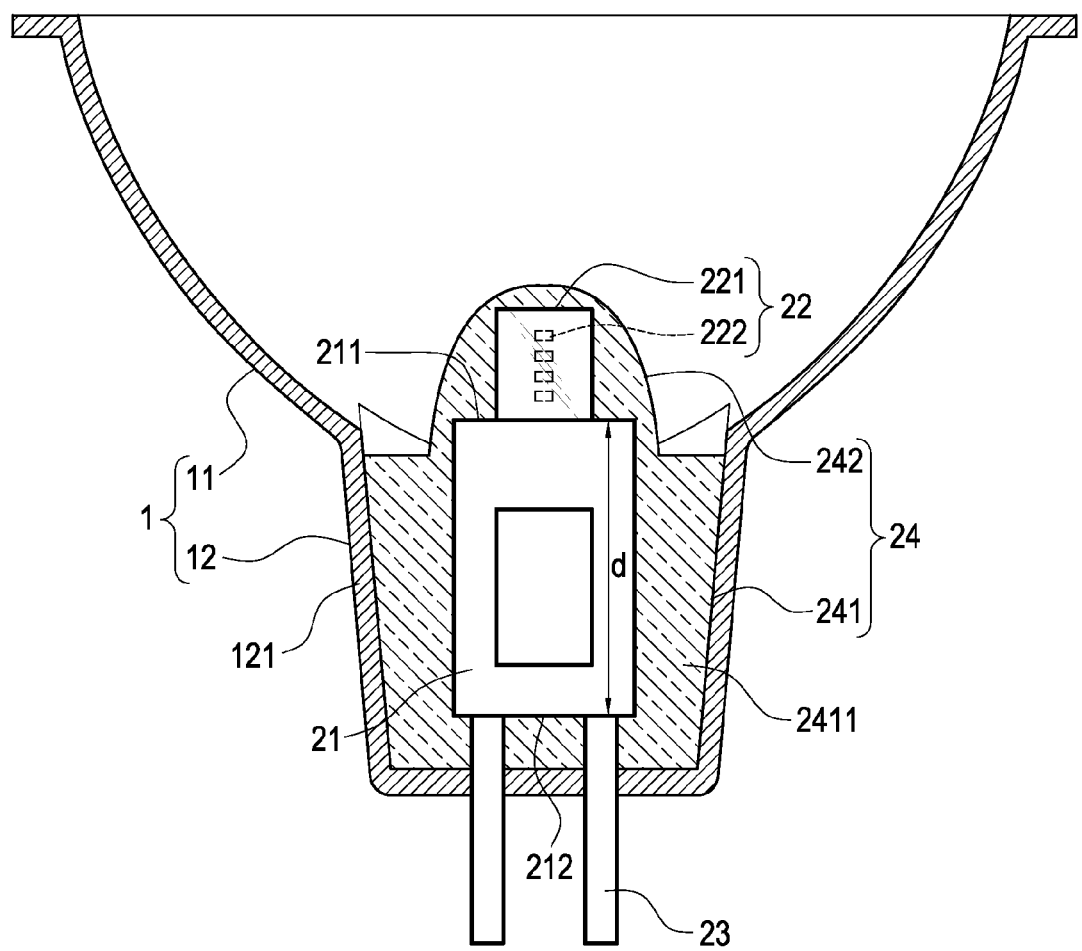
FIG. 6 is a sectional view of a LED lamp structure of the disclosure.
Figure 7:
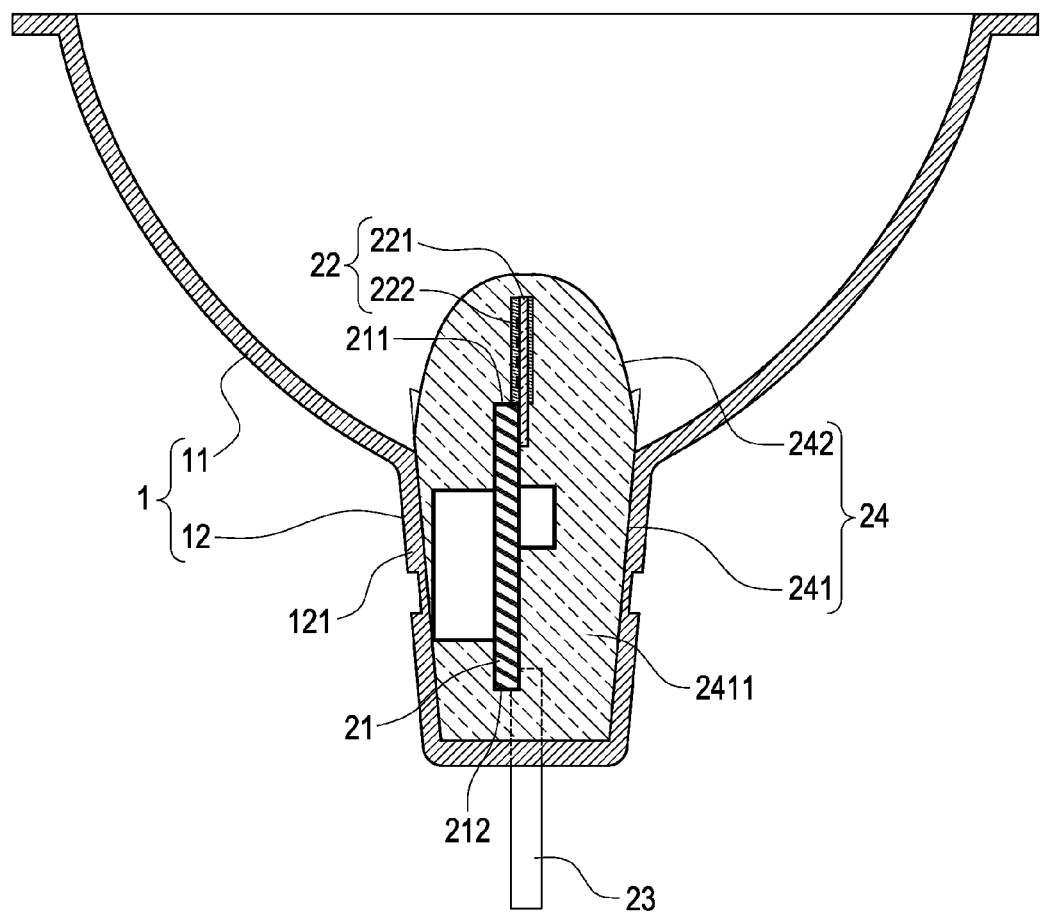
FIG. 7 is another sectional view of a LED lamp structure of the disclosure.

As shown in FIGS. 5 to 7, according to the LED lamp structure 10 of the disclosure, the lamp cup 1 has a bowl-shaped cup 11 and a rectangular shell 12 extending from an end of the bowl-shaped cup 11; the illuminating module 2 passes through and is fixed inside the rectangular shell 12; the circuit board 21 passes through and is fixed to the rectangular shell 12, the circuit board 21 has a length d, a first side 211 and a second side 212, and the first side 211 and the second side 212 are formed at two sides of the length d; the flat plate LED 22 is fixed and electrically connected with the circuit board 21, the flat plate LED 22 bulges at the first side 211 and is exposed from the bowl-shaped cup 11, the flat plate LED 22 comprises a substrate 221 and at least one LED grain 222 assembled on the substrate 221, and the substrate 221 is made of transparent material, such that the flat plate LED 22 can emit omnidirectional light; the electrical pin 23 is fixed and electrically connected with the circuit board 21, and the electrical pin 23 bulges at the second side 212 and is exposed from the rectangular shell 12; the packaging colloid 24 covers the circuit board 21 and the flat plate LED 22, and the packaging colloid 24 has a rectangular plastic block 241 embedded inside the rectangular shell 12.

As shown in FIGS. 2, 3 and 5 to 7, according to the disclosure, when the LED lamp structure 10 and the illuminating module 2 are in use, the circuit board 21 has a length d, a first side 211 and a second side 212, and the first side 211 and the second side 212 are formed at two sides of the length d; the flat plate LED 22 bulges at the first side 211; the electrical pin 23 bulges at the second side 212; the substrate 221 of the flat plate LED 22 is made of transparent material, such that the flat plate LED 22 can emit omnidirectional light; the packaging colloid 24 covers the circuit board 21 and the flat plate LED 22, and the packaging colloid 24 has a rectangular plastic block 241. According to the above described configuration of the circuit board 21, the flat plate LED 22, the electrical pin 23 and the packaging colloid 24, the circuit board 21 can vertically passes through and is fixed to the rectangular shell 12, i.e. the length d of the circuit board 21 is parallel to the extending direction of the rectangular shell 12, such that the flat plate LED 22 is disposed closely to the center of the bowl-shaped cup 11, and thus the reflection can be optimized. In addition, since the substrate 221 is made of transparent material, the light emitted from the LED grain 222 on the substrate 221 can directly pass through the substrate 221 to the bowl-shaped cup 11 for further reflection, such that the LED lamp structure 10 can remain the appearance of traditional halogen lamps and can achieve the effect of collecting light and focusing.

According to the above descriptions, the LED lamp structure and the illuminating module thereof can achieve the purposes and solve the problems met in conventional technologies. Thus, the disclosure involves utility, novelty and inventiveness as well as meets the requirements of patent application. Thus, the application is applied according to Patent Law. The application is kindly requested to be granted for ensuring the right of the inventors.

What is claimed is:
1. A LED lamp structure, comprising:
a lamp cup, having a bowl-shaped cup and a rectangular shell extending from an end of the bowl-shaped cup; and
an illuminating module, passing through and fixed inside the rectangular shell, the illuminating module comprising:
a circuit board, passing through and fixed to the rectangular shell, wherein the circuit board has a length, a first side and a second side, and the first side and the second side are formed at two sides of the length;
a flat plate LED, fixed and electrically connected with the circuit board, wherein the flat plate LED bulges at the first side and is exposed from the bowl-shaped cup, the flat plate LED comprises a substrate and at least one LED grain assembled on the substrate, and the substrate is made of transparent material;
an electrical pin, fixed and electrically connected with the circuit board, wherein the electrical pin bulges at the second side and is exposed from the rectangular shell; and
a packaging colloid, covering the circuit board and the flat plate LED, wherein the packaging colloid has a rectangular plastic block embedded inside the rectangular shell.
2. The LED lamp structure according to claim 1, wherein the rectangular shell is a rectangular conical and annular block, and the size of the peripheral edge of the rectangular conical and annular block decreases along with the direction away from the bowl-shaped cup.

3. The LED lamp structure according to claim 2, wherein the rectangular plastic block is a rectangular and conical block, the size of the peripheral edge of the rectangular and conical block gradually decreases along with the direction of the flat plate LED toward the electrical pin, and the rectangular and conical block is embedded inside the rectangular conical and annular block.

4. The LED lamp structure according to claim 1, wherein the packaging colloid has a convex and curved plastic block connected with one side of the rectangular plastic block, the size of the convex and curved plastic block gradually decreases along with the direction away from the rectangular plastic block, the convex and curved plastic block covers the flat plate LED, and the rectangular plastic block covers the circuit board.

5. The LED lamp structure according to claim 4, wherein the convex and curved plastic block and the rectangular plastic block are integrally formed.

6. The LED lamp structure according to claim 1, wherein the direction of the length is parallel to the extending direction of the rectangular shell.

7. An illuminating module, comprising:
a circuit board, having a length, a first side and a second side, wherein the first side and the second side are formed at two sides of the length;
a flat plate LED, fixed and electrically connected with the circuit board, wherein the flat plate LED bulges at the first side, the flat plate LED comprises a substrate and at least one LED grain assembled on the substrate, and the substrate is made of transparent material;
an electrical pin, fixed and electrically connected with the circuit board, wherein the electrical pin bulges at the second side; and
a packaging colloid, covering the circuit board and the flat plate LED, wherein the packaging colloid has a rectangular plastic block.

8. The illuminating module according to claim 7, wherein the rectangular plastic block is a rectangular and conical block, and the size of the peripheral edge of the rectangular and conical block gradually decreases along with the direction of the flat plate LED toward the electrical pin.

9. The illuminating module according to claim 7, wherein the packaging colloid has a convex and curved plastic block connected with one side of the rectangular plastic block, the size of the convex and curved plastic block gradually decreases along with the direction away from the rectangular plastic block, the convex and curved plastic block covers the flat plate LED, and the rectangular plastic block covers the circuit board.

10. The illuminating module according to claim 9, wherein the convex and curved plastic block and the rectangular plastic block are integrally formed.

* * * * *